US011778911B2

(12) United States Patent
Joshi et al.

(10) Patent No.: US 11,778,911 B2
(45) Date of Patent: Oct. 3, 2023

(54) METHOD, ELECTRONIC APPARATUS, AND SYSTEM FOR DEFECT DETECTION

(71) Applicant: OHIO STATE INNOVATION FOUNDATION, Columbus, OH (US)

(72) Inventors: Shailesh N. Joshi, Ann Arbor, MI (US); Vishnu Baba Sundaresan, Columbus, OH (US); Vijay Venkatesh, Columbus, OH (US); Srivatsava Krishnan, Columbus, OH (US)

(73) Assignee: OHIO STATE INNOVATION FOUNDATION, Columbus, OH (US)

( * ) Notice: Subject to any disclaimer, the term of this patent is extended or adjusted under 35 U.S.C. 154(b) by 218 days.

(21) Appl. No.: 17/036,814

(22) Filed: Sep. 29, 2020

(65) Prior Publication Data
US 2022/0102620 A1  Mar. 31, 2022

(51) Int. Cl.
*H10N 30/05* (2023.01)
*H01L 21/66* (2006.01)
*H10N 30/072* (2023.01)

(52) U.S. Cl.
CPC ............ *H10N 30/05* (2023.02); *H01L 22/10* (2013.01); *H01L 22/12* (2013.01); *H01L 22/20* (2013.01); *H10N 30/072* (2023.02)

(58) Field of Classification Search
CPC ......... H01L 22/00; H01L 22/10; H01L 22/12; H01L 22/20; H01L 41/27; H01L 41/312
See application file for complete search history.

(56) References Cited

U.S. PATENT DOCUMENTS

| 4,668,909 A | * | 5/1987 | Hickernell | G01R 29/22 324/727 |
| 8,120,376 B2 | * | 2/2012 | Hansen | G05B 23/0229 324/555 |
| 9,557,229 B2 | | 1/2017 | Dumitru et al. | |
| 9,964,468 B1 | * | 5/2018 | Wu | G01M 5/00 |
| 2005/0209791 A1 | * | 9/2005 | Senibi | G01N 29/0672 702/33 |

(Continued)

FOREIGN PATENT DOCUMENTS

| JP | 2602256 B2 | 4/1997 | |
| JP | 2020522713 A | * 7/2020 | ............ G01N 29/14 |
| WO | 2017/169313 A1 | 10/2017 | |

*Primary Examiner* — Jeffrey T Carley
(74) *Attorney, Agent, or Firm* — Oblon, McClelland, Maier & Neustadt, L.L.P.

(57) ABSTRACT

Aspects of the disclosure provide a method including determining a measurement configuration for one or more piezoelectric devices in an electronic apparatus. The electronic apparatus includes an electronic device mounted on a substrate block using a bonding layer. The one or more piezoelectric devices including a first subset and a second subset are attached to one of the electronic device and the bonding layer. The method includes performing, based on the measurement configuration, a defect measurement on the electronic apparatus by causing the first subset to transmit and the second subset to receive one or more acoustic signals. The method includes determining whether at least one mechanical defect is located in at least one of (i) the bonding layer, (ii) the electronic device, (iii) the substrate block, (iv) interfaces of the electronic device, the bonding layer, and the substrate block based on the received one or more acoustic signals.

15 Claims, 4 Drawing Sheets

(56) References Cited

U.S. PATENT DOCUMENTS

| | | | |
|---|---|---|---|
| 2010/0088067 A1* | 4/2010 | Jensen | G01R 29/22 |
| | | | 702/56 |
| 2010/0106431 A1* | 4/2010 | Baba | G01N 29/2468 |
| | | | 702/39 |
| 2011/0016975 A1* | 1/2011 | Glaesemann | G01N 29/2437 |
| | | | 73/588 |
| 2012/0248440 A1 | 10/2012 | Hirohata et al. | |
| 2013/0327148 A1* | 12/2013 | Yan | G01N 29/341 |
| | | | 73/628 |
| 2015/0008942 A1* | 1/2015 | Ginther | H04R 29/005 |
| | | | 324/649 |
| 2019/0018123 A1* | 1/2019 | Narasimha-Iyer | |
| | | | G01S 15/8925 |
| 2019/0140560 A1 | 5/2019 | Joshi | |

* cited by examiner

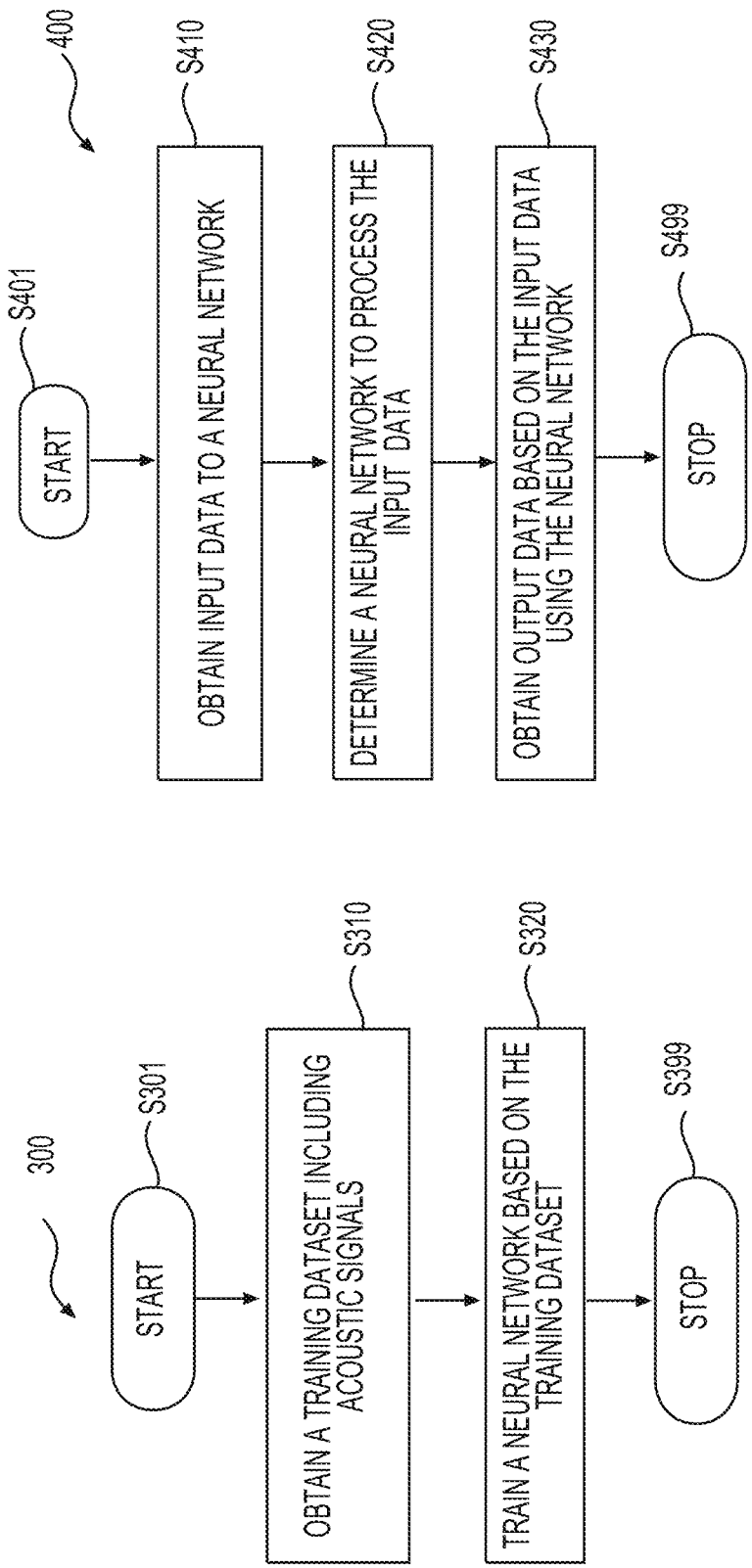

METHOD, ELECTRONIC APPARATUS, AND SYSTEM FOR DEFECT DETECTION

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

U. S. 2019/0140560 A1 describes a system for protecting a power electronic device. The system includes a power electronic device and a controller. The power electronic device includes a piezoelectric substrate. The controller includes a power supply, one or more processors, and one or more memory modules storing computer readable and executable instructions. The computer readable and executable instructions, when executed by the one or more processors, cause the controller to: receive a temperature of the power electronic device, and provide a voltage determined based on the temperature of the power electronic device across the piezoelectric substrate.

SUMMARY

According to the present disclosure, an electronic apparatus is provided. The electronic apparatus includes a substrate block, an electronic device mounted on the substrate block, and a bonding layer positioned between the electronic device and the substrate block to bond the electronic device to the substrate block. The electronic apparatus includes one or more piezoelectric devices attached to one of the electronic device and the bonding layer. A first subset of the one or more piezoelectric devices is configured to transmit one or more acoustic signals. A second subset of the one or more piezoelectric devices is configured to receive the one or more acoustic signals after the one or more acoustic signals propagate in the electronic apparatus. The received one or more acoustic signals indicates whether at least one mechanical defect is located in at least one of (i) the bonding layer, (ii) the electronic device, (iii) the substrate block, (iv) a first interface between the bonding layer and the electronic device, and (v) a second interface between the electronic device and the substrate block.

In an embodiment, the one or more piezoelectric devices are positioned on a surface of the electronic device, the surface being opposite to the first interface. The at least one mechanical defect indicated by the received one or more acoustic signals is located in the first interface and/or the second interface.

In an embodiment, one of the first subset of the one or more piezoelectric devices is reconfigured to receive an acoustic signal after the one of the first subset of the one or more piezoelectric devices transmits one of the one or more acoustic signals.

In an embodiment, one of the second subset of the one or more piezoelectric devices is reconfigured to transmit an acoustic signal after the one of the second subset of the one or more piezoelectric devices receives one of the one or more acoustic signals.

In an example, a frequency and/or a phase shift of one of the one or more acoustic signals is adjustable.

According to the present disclosure, a system for defect detection in an electronic apparatus is provided. The system includes the electronic apparatus and a controller. The electronic apparatus includes a substrate block, an electronic device mounted on the substrate block, a bonding layer positioned between the electronic device and the substrate block to bond the electronic device to the substrate block, and one or more piezoelectric devices attached to one of the electronic device and the bonding layer. A first subset of the one or more piezoelectric devices is configured to transmit one or more acoustic signals, and a second subset of the one or more piezoelectric devices is configured to receive the one or more acoustic signals. The controller includes processing circuitry that is configured to determine a measurement configuration for the one or more piezoelectric devices. The measurement configuration indicates the first subset and the second subset of the one or more piezoelectric devices. The processing circuitry can perform a defect measurement on the electronic apparatus by implementing the measurement configuration for the first subset and the second subset. The processing circuitry can determine whether at least one mechanical defect is located in at least one of (i) the bonding layer, (ii) the electronic device, (iii) the substrate block, (iv) a first interface between the bonding layer and the electronic device, and (v) a second interface between the electronic device and the substrate block based on the received one or more acoustic signals.

In an example, the one or more piezoelectric devices are positioned on a surface of the electronic device where the surface is opposite to the first interface. The at least one mechanical defect indicated by the received one or more acoustic signals is located in the first interface and/or the second interface.

In an example, the processing circuitry is further configured to update the measurement configuration. One of the first subset of the one or more piezoelectric devices is reconfigured to receive an acoustic signal based on the updated measurement configuration.

In an example, the processing circuitry is further configured to update the measurement configuration. One of the second subset of the one or more piezoelectric devices is reconfigured to transmit an acoustic signal based on the updated measurement configuration.

In an example, the measurement configuration further indicates a frequency and/or a phase shift of one of the one or more acoustic signals and is adjustable.

In an embodiment, the processing circuitry is further configured to determine whether the at least one mechanical defect is located in the at least one of (i) the bonding layer, (ii) the electronic device, (iii) the substrate block, (iv) the first interface, and (v) the second interface using machine learning. In an example, the machine learning is based on an artificial neural network.

In an example, the processing circuitry is further configured to perform a reference measurement on the electronic apparatus by implementing the measurement configuration for the first subset and the second subset to obtain one or more reference acoustic signals when the electronic apparatus is in a reference state without a mechanical defect. When the electronic apparatus is in an operational state, the processing circuitry performs the measurement on the electronic apparatus by implementing the measurement configuration for the first subset and the second subset to obtain the received one or more acoustic signals. The processing circuitry determines whether the at least one mechanical defect is located in the at least one of (i) the bonding layer, (ii) the electronic device, (iii) the substrate block, (iv) the first interface, and (v) the second interface based on the received one or more acoustic signals and the one or more reference acoustic signals.

According to an aspect of the present disclosure, a method for defect detection in an electronic apparatus is provided. The method includes determining a measurement configuration for one or more piezoelectric devices in the electronic apparatus. The electronic apparatus includes an electronic device mounted on a substrate block using a bonding layer and the one or more piezoelectric devices being attached to one of the electronic device and the bonding layer. The method includes performing, based on the measurement configuration, a defect measurement on the electronic apparatus by causing a first subset of the one or more piezoelectric devices to transmit one or more acoustic signals and causing a second subset of the one or more piezoelectric devices to receive the one or more acoustic signals. The method includes determining whether at least one mechanical defect is located in at least one of (i) the bonding layer, (ii) the electronic device, (iii) the substrate block, (iv) a first interface between the bonding layer and the electronic device, and (v) a second interface between the electronic device and the substrate block based on the received one or more acoustic signals.

In an embodiment, the one or more piezoelectric devices are positioned on a surface of the electronic device, the surface being opposite to the first interface. The at least one mechanical defect indicated by the received one or more acoustic signals is located in the first interface and/or the second interface.

In an example, the method includes determining a subsequent measurement configuration for the one or more piezoelectric devices. The method includes performing, based on the subsequent measurement configuration, a subsequent measurement on the electronic apparatus. In the subsequent measurement, a third subset of the one or more piezoelectric devices is caused to transmit one or more subsequent acoustic signals. Further, a fourth subset of the one or more piezoelectric devices is caused to receive the one or more subsequent acoustic signals. The method includes determining whether the at least one mechanical defect is in the at least one of (i) the bonding layer, (ii) the electronic device, (iii) the substrate block, (iv) the first interface, and (v) the second interface based at least on the received one or more subsequent acoustic signals.

In an example, the measurement configuration further indicates a frequency and/or a phase shift of one of the one or more acoustic signals and is adjustable.

In an example, determining whether the at least one mechanical defect is located comprises determining whether the at least one mechanical defect is located in the at least one of (i) the bonding layer, (ii) the electronic device, (iii) the substrate block, (iv) the first interface, and (v) the second interface based on the received one or more acoustic signals and machine learning. In an example, the machine learning is based on an artificial neural network.

In an example, performing the defect measurement includes performing the defect measurement on the electronic apparatus by implementing the measurement configuration for the first subset and the second subset to obtain the received one or more acoustic signals when the electronic apparatus is in an operational state. The method further includes causing the first subset of the one or more piezoelectric devices to transmit the one or more acoustic signals and causing the second subset of the one or more piezoelectric devices to receive one or more reference acoustic signals when the electronic apparatus is in a reference state without a mechanical defect. The method includes determining whether the at least one mechanical defect is located in the at least one of (i) the bonding layer, (ii) the electronic device, (iii) the substrate block, (iv) the first interface, and (v) the second interface based on the received one or more acoustic signals and the one or more reference acoustic signals.

BRIEF DESCRIPTION OF THE DRAWINGS

Various embodiments of this disclosure that are proposed as examples will be described in detail with reference to the following figures, wherein like numerals reference like elements, and wherein:

FIG. 3 shows a process to form a training dataset and to train a neural network according to the present disclosure;

FIG. 4 shows a process to use a neural network to process input data according to the present disclosure.

DETAILED DESCRIPTION

Operation of semiconductor devices or modules, for example, in electrified vehicles can generate large heat flux in a power electronics assembly (also referred to as a power electronics package). Due to difference in coefficients of thermal expansion (CTEs) between various layers or components in the power electronics assembly, one or more layers of the power electronics assembly may flex due to thermomechanical strains, which may induce thermomechanical stresses, and thus may cause a semiconductor chip in the power electronics assembly to crack and become damaged. To understand how the power electronics assembly performs with respect to generation of heat flux, the thermomechanical stresses created during operation can be measured. Examples of measuring techniques can include direct image correlation (stereo), usage of a strain gauge, and usage of a nanofabricated array. Aspects of the disclosure provide a method, electronic apparatus, and a system for detecting sub-surface defects in a power electronic module. The sub-surface defects can be located in a bonding layer between the power electronic module and a substrate or in interfaces associated with the bonding layer.

Figure 1:
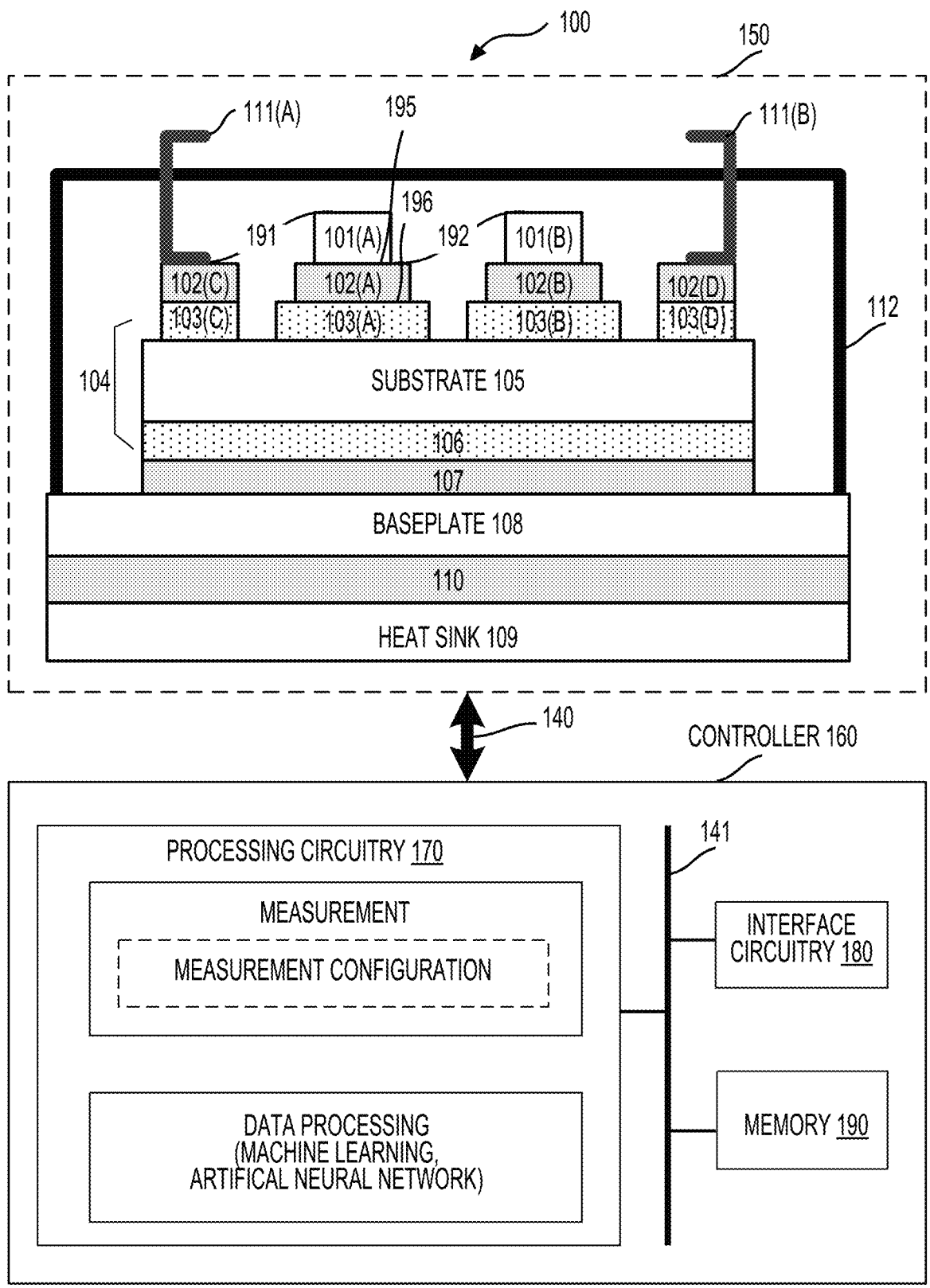
FIG. 1 shows an exemplary system for detecting defect(s) in an electronic apparatus according to the present disclosure.

FIG. 1 shows an exemplary system 100 for detecting defect(s) in an electronic apparatus 150, such as a power electronic apparatus in a vehicle (e.g., an electric vehicle or a hybrid vehicle). The system 100 can include the electronic apparatus 150 and a controller 160. The electronic apparatus 150 can include an electronic device 101(A) (e.g., a high power semiconductor device, a semiconductor chip, such as a high power diode, an insulated-gate bipolar transistor (IGBT)), a bonding layer 102(A), and a substrate block (e.g., a metal substrate) 104. In an example, a power electronic assembly includes the electronic apparatus 150. The electronic device 101(A) and the substrate block 104 can be bonded through the bonding layer 102(A). The bonding layer 102(A) can be a solder layer. The substrate block 104 can include any suitable material(s) or a combination of conductive and insulating materials. In an example, the substrate block 104 includes a substrate 105 positioned between a first copper (Cu) layer 103(A) and a second Cu layer 106, and thus is referred to as a Direct Bonded Copper (DBC). The substrate 105 can include ceramic material(s). The substrate block 104 can be further attached to (or mounted on) one or more layers or substrates. In an example, the substrate block 104 is mounted on a baseplate 108 using a bonding layer 107 (e.g., a solder layer). The baseplate 108 can be attached to (or mounted on) a heat sink 109 using a thermal interface 110. In an example, the electronic apparatus 150 includes a case 112 that can enclose the electronic device 101(A) and the substrate block 104.

In some examples, the electronic apparatus 150 includes a plurality of electronic devices 101 (e.g., multiple semiconductor chips), such as 101(A), 101(B), and the like. In an example, the plurality of electronic devices 101 is identical. The above description for the electronic device 101(A) can be suitably adapted to describe the electronic device 101(B). Further, the above descriptions for the bonding layer 102(A) and the first Cu layer 103(A) can be suitably adapted to describe the bonding layer 102(B)-102(D) and the first Cu layer 103(B)-103(D), respectively. In an example, electrical connections (e.g., metal wires) 191-192 are used to electrically couple the electronic devices 101 internally and to electrically couple the electronic devices 101 to bus bars 111(A)-111(B). Electrical connections (e.g., bus bars 111(A), 111(B), and 140) can be used to electrically couple the electronic devices 101 with external circuits and/or controllers (e.g., the controller 160). The external circuits and/or the controllers can be a part of the power electronic assembly or located outside the power electronic assembly.

In general, one or more power semiconductor dies or chips (e.g., the electronic devices 101) can be mechanically, thermally, and electrically attached to a substrate (e.g., the substrate block 104) in a power semiconductor module (e.g., the electronic module 150). Different materials, such as semiconductor materials (e.g., silicon, silicon carbide, gallium nitride), conductive materials (e.g., solder, Cu), and insulating materials (e.g., ceramic) in different components of the electronic apparatus 150 can have different CTEs. CTE mismatch or the thermal expansion mismatch among the different components or materials in the electronic apparatus 150 can cause mechanical stress or thermal stress, for example, as an operating temperature of the electronic apparatus 150 deviates significantly from a certain range. In an example, operation of the electric devices 101 generates heat flux and causes thermomechanical stress on the power electronics assembly that includes the electronic apparatus 150.

The mechanical stress can affect the structure of the power semiconductor modules and form mechanical defect(s), such as mechanical deformations, cracks, voids, delamination of materials and/or interfaces, and thus can lead to the failure (e.g., mechanical, thermal and/or electrical failure) of the power semiconductor module.

Defects can occur during operation of the electronic apparatus 150 as an operating temperature of the electronic apparatus 150 increases. Defects can form when a temperature of the electronic apparatus 150 decreases. In an embodiment, the bonding layer 102(A) can be subject to thermal stress caused by CTE mismatch between the substrate block 104 and the electronic device 101(A). Thus defects, (e.g., mechanical deformations, cracks, voids, delamination) can form at a first interface 195 between the electronic device 101 and the bonding layer 102, at a second interface 196 between the bonding layer 102 and the substrate block 104 (e.g., the first Cu layer 103), and/or the like. In some examples, the defects at the first interface 195 and/or the second interface 196 are significantly higher than defects in other regions of the electronic apparatus 150.

Figure 2:
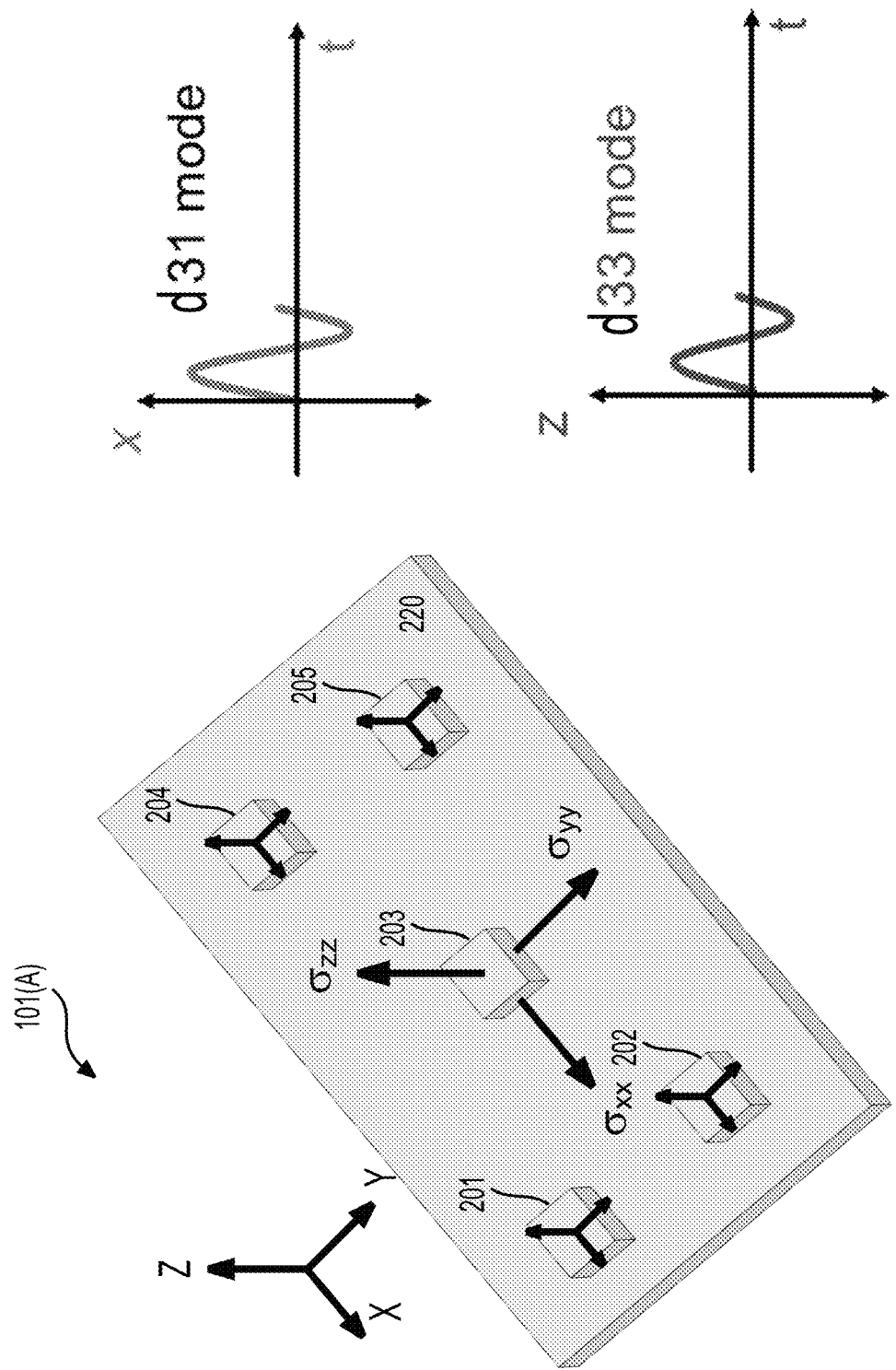
FIG. 2 shows one or more piezoelectric devices in the electronic apparatus according to the present disclosure.

One or more acoustic transducers can be formed in the electronic apparatus 150 to detect defects in the electronic apparatus 150. Referring to FIG. 2, the one or more acoustic transducers can include piezoelectric devices 201-205. A first subset of the one or more acoustic transducers can transmit acoustic wave(s) (or acoustic signal(s)) that propagate in components in the electronic apparatus 150, and subsequently the acoustic signal(s) can be received by a second subset of the one or more acoustic transducers after propagating in the components in the electronic apparatus 150. The defects can affect the propagation (e.g., including transmittance and/or reflectance) of the acoustic wave(s), and thus affect the received acoustic signal(s). Accordingly, defect information (e.g., whether the defects form in the electronic apparatus 150, characteristics of the defects such as a distribution (e.g., locations of defects) and a density of the defects) can be determined based on the received acoustic signal(s).

According to aspects of the disclosure, the one or more acoustic transducers can be positioned in any suitable position in the electronic apparatus 150. In an example, the one or more acoustic transducers are positioned close to the component to be measured. The one or more acoustic transducers can be attached to any suitable component, such as the electronic devices 101 and/or the bonding layer 102. The one or more acoustic transducers can be formed using any suitable material(s) including piezoelectric material(s) with any suitable dimensions and shapes.

According to aspects of the disclosure, referring to FIG. 2, the one or more acoustic transducers include piezoelectric devices 201-205 attached to and positioned above the electronic device 101(A). The piezoelectric devices 201-205 can be located close to the bonding layer 102, for example, to measure defect(s) related to the bonding layer 102. In some examples, the piezoelectric devices 201-205 can be attached to (e.g., mounted directly above) the bonding layer 102. In an example, a thickness of each of the piezoelectric devices 201-205 is in a range of 0.1 to 1 millimeter (mm). A dimension (e.g., a width, a length, a diameter) of each of the piezoelectric devices 201-205 is in a range of 1 to 10 mm. In an example, each of the piezoelectric devices 201-205 has a dimension of about $5 \times 5 \times 0.5$ mm$^3$ where a height that is parallel to the Z direction can be 0.5 mm. Any suitable number of piezoelectric devices can be distributed in any suitable spatial pattern over a top surface 220 of the electronic device 101(A). The piezoelectric devices 201-205 can include any suitable piezoelectric material(s), such as aluminum nitride or lead zirconate titanate (PZT). The piezoelectric devices 201-205 can be fabricated using any suitable methods, such as deposition methods (e.g., chemical vapor deposition (CVD)). In an example, piezoelectric layers made from aluminum nitride or similar piezoelectric materials formed by CVD are deposited on the electronic device 101(A), or at locations proximate to the bonding layer 102.

The piezoelectric devices 201-205 can be used as acoustic wave transmitter and/or receivers to detect defects, such as sub-surface defects in the electronic apparatus 150. For example, one of the piezoelectric devices 201-205 is configured to be a transmitter (Tx) that transmits an acoustic wave (or an acoustic signal) at a time t0 and is configured to be a receiver (Rx) that receives an acoustic signal at a time t1. Alternatively, one of the piezoelectric devices 201-205 includes at least one transmitter and at least one receiver that can transmit acoustic signal(s) and receive acoustic signal(s). According to aspects of the disclosure, a first subset of the piezoelectric devices 201-205 can be configured to transmit one or more acoustic signals, a second subset of the piezoelectric devices 201-205 can be configured to receive the one or more acoustic signals. Referring to FIG. 2, in an example, the piezoelectric device 201 is configured to be a transmitter and the piezoelectric devices 202-205 are configured to be receivers, and thus forming a Tx-Rx pattern that includes the Tx 201 and the Rxs 202-205. Different Tx-Rx patterns can be used to detect defects having different characteristics (e.g., different spatial distribution).

Each of the piezoelectric devices 201-205 or the Tx-Rx pattern can be reconfigured (changed or switched) in real-time or on-the-fly during a defect measurement (also referred to as a measurement), for example, when the electronic apparatus 150 is in operation or not in operation. Each piezoelectric device can be switched between being a receiver and being a transmitter on-the-fly to detect defects (e.g., sub-surface damages or defects). In another example, the Tx-Rx pattern is switched to include the Tx 203 and the Rxs 201, 202, 204, and 205. In some examples, a subset of the piezoelectric devices 201-205 forms the Tx-Rx pattern, such as the Tx 203 and the Rxs 201 and 205.

In addition to switch or reconfigure the Tx-Rx pattern, other characteristics (e.g., a frequency, a phase shift) of an acoustic wave can be configured or varied to better detect defects. Further, referring to FIG. 2, different acoustic wave modes (e.g., a longitudinal mode d33, a transverse mode d31) can be used, and thus one of the piezoelectric devices 201-205 can be configured to emit the longitudinal mode d33, the transverse mode d31, or the like.

In the d33 mode, a deformation direction, an electric field direction, and a polarization direction are parallel, for example, along a Z direction. One of the piezoelectric devices 201-205 can operate in the d33 mode, and produce an acoustic signal in the Z-direction.

In the d31 mode, the electric field direction and the polarization direction are parallel, for example, along the Z direction, and the deformation direction is parallel to an X direction that is perpendicular to the Z direction. One of the piezoelectric devices 201-205 can operate in the d31 mode, and produce an acoustic signal in the X-direction.

Parameters $\sigma_{xx}$, $\sigma_{yy}$, and $\sigma_{zz}$, can indicate stress for a piezoelectric device.

Transmittance and/or reflectance change of an acoustic signal due to damage/defects within a layer can enable detection of the damage. Spectral models can be used to analyze input signal(s) versus output signal(s) and can correlate to the presence of damage. In general, an acoustic signal can be emitted from a piezoelectric device (e.g., 203), and can propagate in the electronic device 101(A), the bonding layer 102(A), and the substrate block 104. The acoustic signal can propagate to other components (e.g., the electronic device 101(B), and the bonding layer 102(B)). In addition to wave propagation or transmittance, the acoustic signal can be reflected at any suitable interfaces. The interfaces can include the first interface 195 between the electronic device 101 and the bonding layer 102, the second interface 196 between the bonding layer 102 and the substrate block 104, an interface caused by a crack, and the like. Thus, the acoustic signal received by a piezoelectric device can indicate wave transmittance and/or wave reflectance, and thus indicating defects along a propagation path or defects that cause reflectance changes.

In some examples, the electronic apparatus 150 can include the electronic devices 101 that are semiconductor power electronic devices, for example, based on silicon carbide (SiC), silicon (Si), or any suitable semiconductor material(s). SiC is a wide-bandgap semiconductor, and SiC-based power switches can be used in automotive electrical subsystems.

Referring back to FIG. 1, the controller 160 can includes processing circuitry 170, memory 190, and interface circuitry 180 that are electrically coupled, for example, by a bus bar 141. In an example, the interface circuitry 180 includes the bus bar 140. In the FIG. 1 example, the components are coupled together by a bus architecture including the bus 141. Other suitable interconnection techniques can also be used.

The processing circuitry 170 can be configured to determine a measurement configuration for the one or more transducers, such as the piezoelectric devices 201-205. The measurement configuration can indicate the Tx-Rx pattern described above. The Tx-Rx pattern can include the first subset of the piezoelectric devices 201-205 that is configured to transmit acoustic signal(s) and the second subset of the piezoelectric devices 201-205 that is configured to receive the acoustic signal(s).

The measurement configuration can indicate acoustic wave modes (e.g., the d31 mode, the d33 mode), one or more frequencies, and phase information of the acoustic signal(s). In an example, an acoustic signal is multimodal, and thus includes multiple spatial modes. A first spatial mode can detect certain defects more effectively than a second spatial mode. Thus, the measurement configuration can be selected for the first subset and the second subset of the piezoelectric devices 201-205 to transmit and/or receive predominantly the first spatial mode and to suppress transmission/reception of the second spatial mode. In an example, a frequency of an acoustic signal can be selected or tuned to select or suppress a spatial mode of the acoustic signal. Frequency tuning can be implemented on-the-fly during a defect measurement.

In an example, characteristics of an acoustic transducer (e.g., one of the piezoelectric device 201-205), such as dimension(s), a shape, material(s) of the acoustic transducer can be selected or tuned for the acoustic transducer to transmit or receive certain spatial mode(s) more effectively than other spatial mode(s).

When a transducer array (e.g., the piezoelectric devices 201-205), is used to detect defects, the Tx-Rx pattern based on the transducer array, phases and/or timing for transducers in the first subset that transmits acoustic signal(s) can be configured on-the-fly in real time, for example, during a defect measurement. In an example, frequencies, phases and/or timing (e.g., time delays) of multiple transducers in the first subset are selected to cause constructive interference, and thus generate an acoustic signal with a large amplitude.

In an example, a transducer array includes a large number of transducers, and the Tx-Rx pattern having any suitable shape can be generated in real time by configuring a subset of the transducer array as transmitter(s) and another subset as receiver(s) during a measurement. Thus, the measurement configuration can be changed in real time to adapt to various defect characteristics, such as defect distributions. When the electronic apparatus 150 is in operation, defect characteristics can change, and thus, adjusting the measurement configuration in real time or on-the-fly can be advantageous and can better detect defects in the electronic apparatus 150.

In an example, the processing circuitry 170 can determine an initial measurement configuration. The initial measurement configuration indicates that the piezoelectric device 203 is a transmitter and the piezoelectric devices 201, 202, 204, and 205 are receivers. Thus, the first subset includes the piezoelectric devices 203, and the second subset includes the piezoelectric devices 201, 202, 204, and 205. The processing circuitry 170 can subsequently perform a measurement by causing the piezoelectric device 203 to transmit an acoustic signal (e.g., with a certain mode, a frequency). The acoustic signal propagates among various components and/or interfaces, and optionally can experience reflection(s) caused by the interfaces. The acoustic signal can be received by the piezoelectric devices 201, 202, 204, and 205. Data can be sent to the processing circuitry 170, for example, via the bus bar 140.

In some examples, the processing circuitry 170 is configured to update the initial measurement configuration to generate an updated measurement configuration. For example, the updated measurement configuration indicates that the piezoelectric device 201 is a transmitter and the piezoelectric devices 202 and 203 are receivers. Thus, one of the first subset of the piezoelectric devices 201-205 is reconfigured from a transmitter to a receiver, and thus is reconfigured to receive an acoustic signal. One of the second subset of the piezoelectric devices 201-205 is reconfigured from a receiver to a transmitter, and thus is reconfigured to transmit an acoustic signal.

The processing circuitry 170 can be configured to measure the electronic apparatus 150, for example, by implementing the measurement configuration for the first subset of the piezoelectric devices 201-205 and the second subset of the piezoelectric devices 201-205. The processing circuitry 150 can cause the first subset (also referred to as transmitter(s)) to transmit acoustic signal(s) based on the measurement configuration. The acoustic signal(s) can propagate in the electronic apparatus 150, such as in at least one of (i) the bonding layer 102, (ii) the electronic device 101, and (iii) the substrate block 104. The acoustic signal(s) can propagate in other components, such as the bonding layer 107, the baseplate 108, and the thermal interface 110, and/or the like.

As described above, in some examples, the defects located in the first interface 195 and in the second interface 196 can dominate over defects located in other components when the electronic apparatus 150 is in operation. Alternatively, the defects located in the first interface 195 and the second interface 196 may experience larger changes than defects in other components. Therefore, detecting the defects located in the first interface 195 and in the second interface 196, for example, when the electronic apparatus 150 is in operation can be important. In general, the acoustic signal(s) in a component can have larger amplitude(s) when the component is closer to the transmitter(s) of the acoustic signal(s). Amplitude(s) of the acoustic signal(s) can also be affected by various materials (e.g., a dielectric medium) along the path of the propagation of the acoustic signal(s). Accordingly, in some examples, referring to FIGS. 1-2, the transmitter(s) and the receiver(s) (e.g., one or more of the piezoelectric devices 201-205) are attached to the surface 220 of the electronic device 101 (e.g., 101(A), 101(B)) in order that the acoustic wave(s) can have larger amplitude(s) at the first interface 195 and the second interface 196. Thus, the acoustic wave(s) can be sensitive to the defects induced in the first interface 195 and in the second interface 196.

The processing circuitry 170 can process data including the acoustic signal(s) received by the second subset of the piezoelectric devices 201-205. The processing circuitry 170 can determine, based on the received acoustic signal(s), whether defect(s), such as mechanical defects (or structural defects) are located in the electronic apparatus 150, such as one or more of (i) the bonding layer 102, (ii) the electronic device 101, (iii) the substrate block 104, (iv) the first interface 195, and (v) the second interface 196.

In an example, as described above, the defects are known to occur predominantly or exclusively in interface(s) between different components. Thus, the defects being determined to occur in the electronic apparatus 150 can indicate that the defects are located within the first interface 195 and/or the second interface 196.

In an example, defects can occur in any suitable component or any suitable interface, characteristics (e.g., spatial distribution of the defect(s), nature of the defects) of the defect(s) are be further determined based on the received acoustic signal(s).

The processing circuitry 170 can be configured to determine whether the defect(s) are in the electronic apparatus 150 based on machine learning. The processing circuitry 170 can be configured to determine characteristics of the defect(s) within the electronic apparatus 150 based on machine learning. The characteristics of the defect(s) can include locations of the defect(s) (e.g., a distribution of the defect(s)), nature of the defect(s) (e.g., delamination, cracks), and/or the like. For example, based on machine learning and the received acoustic signal(s), the processing circuitry 170 can determine that defect(s) occur in the first interface 195 and/or the second interface 196, and thus the defect(s) can include delamination of the bonding layer 102 from either the electronic device 101 or the substrate block 104.

In some examples, when the electronic apparatus 150 is in a reference state, for example, without defects, the processing circuitry 170 is configured to perform a reference measurement on the electronic apparatus 150 by implementing a measurement configuration for the first subset and the second subset. Acoustic signal(s) received and used for data processing is referred to as reference acoustic signal(s). In an example, the electronic apparatus 150 is not in operation and temperatures of components in the electronic apparatus 150 are within a preset range. Subsequently, when the electronic apparatus 150 is in an operational state, the processing circuitry 170 is configured to perform a measurement on the electronic apparatus 150 by implementing the measurement configuration for the first subset and the second subset. The processing circuitry 170 can be configured to determine whether defect(s) occur within the electronic apparatus 150 during the operational state. In an example, the processing circuitry 170 determines whether defect(s) occur in the at least one of (i) the bonding layer 102, (ii) the electronic device 101, (iii) the substrate block 104, (iv) the first interface 195, and (v) the second interface 196 based on the received acoustic signal(s) in the operational state and the reference acoustic signal(s). Alternatively, the processing circuitry 170 determines whether the defect(s) occur in the at least one of (i) the bonding layer 102, (ii) the electronic device 101, (iii) the substrate block 104, (iv) the first interface 195, and (v) the second interface 196 based on the received acoustic signal(s) in the operational state.

Any suitable data processing can be performed on the received acoustic signal(s). In some examples, acoustic signal(s) received by the second subset of the piezoelectric devices 201-205 include signal(s) in a time domain. The time domain acoustic signal(s) can be transformed into a frequency domain. The time domain acoustic signal(s) and/or the frequency domain acoustic signal(s) can be further down-sampled, filtered, and/or the like before being processed or analyzed.

In an embodiment, the machine learning is based on an artificial neural network (often simplified as "a neural network"), and the processing circuitry 170 can be configured to process the received acoustic signals using the neural network, and thus can determine whether the defect(s) are located in the electronic apparatus 150 and the characteristics of the defect(s) using the neural network.

The interface circuitry 180 can be configured to communicate data/information between the controller 160 and at least one of (i) the electronic apparatus 150 and (ii) a user. The interface circuitry 180 receive data related to defect detection or instructions for defect detection. The interface circuitry 180 can include any suitable individual device or any suitable integration of multiple devices such as touch screens, keyboards, keypads, a mouse, joysticks, microphones, universal series bus (USB) interfaces, optical disk drives, wireless receivers, and the like. The interface circuitry 180 can also include a controller that convert data into electrical signals and send the electrical signals to the processing circuitry 170.

The interface circuitry 180 can be configured to output data related to defect detection. The interface circuitry 180 can include any suitable individual device or any suitable integration of multiple devices such as display devices, audio devices, such as speakers, wireless transmitters, and the like. The interface circuitry 180 can also include a controller that convert electrical signals from the processing circuitry 170 to the data, such as visual signals including text messages used by a display device, audio signals used by a speaker, and the like. The interface circuitry 180 can output inquires, such as questions, comments, and the like related to defect detection.

The interface circuitry 180 can be configured to communicate with any suitable device using any suitable communication technologies, such as wired, wireless, fiber optic communication technologies, and any suitable combination thereof. In an example, the interface circuitry 180 can be used to communicate with other vehicles in vehicle to vehicle (V2V) communication, and with an infrastructure, such as a cloud services platform, in vehicle to infrastructure (V2X) communication. In an example, the interface circuitry 180 can communicate with portable sensors (e.g., temperature sensors) and other mobile devices including a mobile phone via any suitable wireless technologies such as IEEE 802.15.1 or Bluetooth. The interface circuitry 180 can include any suitable communication devices using any suitable communication technologies. In an example, the interface circuitry 180 can use wireless technologies, such as IEEE 802.15.1 or Bluetooth, IEEE 802.11 or Wi-Fi, mobile network technologies including such as global system for mobile communication (GSM), universal mobile telecommunications system (UMTS), long-term evolution (LTE), fifth generation mobile network technology (5G) including ultra-reliable and low latency communication (URLLC), and the like.

The memory 190 is configured to store information for defect detection, such as training datasets and parameters for trained neural networks, measurement configurations, acoustic signals, defect information, parameters related to operating the electronic apparatus 150, and/or the like. Information in the memory 190 can be modified by the processing circuitry 170. The memory 190 can be a non-volatile storage medium. The memory 190 includes both non-volatile and volatile storage media. A portion of the memory 190 can be integrated into the processing circuitry 170. The memory 190 can be located remotely and communicate with the processing circuitry 170 via a wireless communication standard using the interface circuitry 180.

One or more components of the interface circuitry 180, the processing circuitry 170, and the memory 190 can be made by discrete devices or integrated devices. The circuits for one or more of the interface circuitry 180, the processing circuitry 170, and the memory 190 can be made by discrete circuits, one or more integrated circuits, application-specific integrated circuits (ASICs), and the like. The processing circuitry 170 can also include one or more central processing units (CPUs), one or more graphic processing units (GPUs), dedicated hardware or processors to implement neural networks, and the like. In an example, the interface circuitry 180, the processing circuitry 170, and the memory 190 is integrated into a single device. Alternatively, the interface circuitry 180, the processing circuitry 170, and the memory 190 can be distributed among multiple devices that are communicatively coupled.

In an example shown in FIG. 1, components (e.g., the interface circuitry 180, the processing circuitry 170, and the memory 190) in the controller 160 are located outside the electronic apparatus 150 and can be configured to communicate with the electronic apparatus 150 via the interface circuitry 180.

Alternatively, one or more of the components (e.g., the interface circuitry 180, the processing circuitry 170, and the memory 190) in the controller 160 can be located inside the electronic apparatus 150 (e.g., enclosed by the case 112) and can be configured to communicate with the electronic apparatus 150 via wired and/or wireless connections.

The neural network, such as a deep neural network, a convolutional neural network (CNN), and the like, can be trained, for example, using acoustic signals obtained for electronic apparatuses with various defects and without defects. The acoustic signals can be generated using various Tx-Rx patterns, acoustic wave modes, frequencies, phase information, various electronic apparatus components, various operational states of the electronic apparatuses, and/or the like.

The neural network can be trained such that inputting one or more acoustic signals to the neural network can generate a result indicating whether defect(s) are located in an electronic apparatus and optionally location(s) of the defect(s) in the electronic apparatus. Then the trained neural network can be used by the processing circuitry 170 to analyze measurement results based on the received acoustic signal(s).

The acoustic signals used to train the neural network can be referred to as a training dataset. The training data set can be obtained using simulations, experiments, or a combination of simulations and experiments. FIG. 3 shows a process 300 to form a training dataset and to train a neural network according to an embodiment of the disclosure. The process 300 starts at S301, and proceeds to S310.

At S310, the training dataset having acoustic signals corresponding to one or more electronic apparatuses can be obtained. The acoustic signals can be generated using various Tx-Rx patterns, acoustic wave modes, frequencies, phase information, various electronic apparatus components, various operational states of the electronic apparatuses, and/or the like. The acoustic signals can be obtained for the one or more electronic apparatuses with and without defects. The acoustic signals can be obtained with the one or more electronic apparatuses being in various operational states (e.g., in operation having a first setting, in operation having a second setting, not in operation).

The training dataset can be tailored to different structures of an electronic apparatus, different operational states, different measurement configurations, and the like, for example, to train various neural networks to be used for detecting defects in different electronic apparatuses and operated under different conditions. As a result, the trained neural networks can be customized and tailored to certain electronic apparatuses and operated under certain conditions, and the like.

Additional data processing methods can be included in S310 to reduce a training time in S310. For examples, an acoustic signal is down-sampled to obtain reduce data size and expedite the training in S310.

In some examples, a neural network is trained using a training dataset, validated using a validation dataset, and further tested using a test dataset. Therefore, in some embodiments, additional datasets, such as a validation dataset and a test dataset, are formed from additional acoustic signals.

At S320, the neural network is trained based on the training dataset obtained at S310. In some embodiments, the neural network is trained offline, and then stored in the memory 190 to be used later, for example, during data processing.

In general, a neural network can learn and perform a task from examples, such as a training dataset including acoustic signals and corresponding distributions of defects, without task specific instructions. A neural network can be based on a computational model including nodes. The nodes, also referred to as neurons, interconnected by connections, can perform computational tasks. In an embodiment, a neural network can be characterized by a computational model and parameters. In an example, the parameters can include weights and thresholds associated with connections and nodes in the neural network.

In an embodiment, a neural network can be organized in multiple layers where different layers can perform different kinds of computations. The multiple layers can include an input layer having input nodes, an output layer having output nodes, and hidden layers between the input layer and the output layer. In an embodiment, the input layer can receive an input signal originated from outside of the neural network. The output layer can send a result to outside of the neural network. In some embodiments, a neural network can be a deep neural network that has, for example, a relatively larger number of hidden layers than that of a shallow neural network. In an example, a neural network can be a CNN.

In various embodiments, a computational model of a neural network can be determined by search algorithms, and the like. Subsequently, the neural network can be trained using examples related to a certain task. As a result, the parameters are modified repetitively when additional examples are used. In an embodiment, a large number of examples can be organized into multiple independent datasets, such as a training dataset and a validation dataset, to train and validate a neural network to obtain an optimal neural network.

In an embodiment, neural networks having various computational models can be trained using multiple training methods based on a training dataset including data pairs. A data pair includes an input signal (e.g., an acoustic signal) and an expected output signal (e.g., a distribution of defects). An input layer of a neural network can receive the input signal, and the neural network can subsequently generate a result via the output layer. The result can be compared with the expected output signal. The parameters of the neural network are modified or optimized to minimize a difference between the result and the expected output signal.

In some embodiments, the neural network is trained using the training dataset obtained in S310 to optimize parameters of the neural network. Neural networks can be trained using respective training methods to have optimized parameters.

An optimal neural network is obtained by further applying a validation dataset on the trained neural networks, analyzing the results and the expected output signals associated with the validation dataset. The optimal neural network can be deployed to perform a certain task. In addition, performance of the optimal neural network can be further assessed by a test dataset. In an example, the test dataset is independent from other datasets, such as the training dataset and the validation dataset.

In some embodiments, the neural network can be repetitively trained when additional data are available. For example, steps S310 and S320 can be implemented repetitively.

In some embodiments, the neural network is trained to determine whether defects are located in an electronic apparatus and a distribution of the defects. The process 300 then proceeds to S399, and terminates.

The process 300 can be suitably adapted. Step(s) in the process 300 can be modified and/or omitted. Additional step(s) can be added. Any suitable order of implementation can be used.

FIG. 4 shows a process 400 according to an embodiment of the disclosure. In some embodiments, the process 400 is used to determine whether defects are located in the electronic apparatus 150 and to determine optionally characteristics (e.g., a distribution) of the defects. The process 400 starts at S401, and proceeds to S410.

At S410, input data to the neural network is obtained. In an embodiment, the input data is acoustic signal(s) received by receiver(s) (e.g., the second subset) in the piezoelectric devices 201-205. In some embodiments, the acoustic signal(s) received by the receiver(s) can be processed based on certain features of the acoustic signal(s) to generate the input data to the neural network to make the process 400 more efficient. For example, the acoustic signal(s) can be Fourier transformed into a frequency domain. Further, the acoustic signal(s) can be filtered in the frequency domain before being used as the input data to the neural network.

At S420, a suitable neural network is determined to process the input data, for example, when multiple neural networks are available. As described above, a plurality of neural networks can be customized and tailored to certain electronic apparatuses and operated under certain conditions, and the like. Accordingly, the suitable neural network can be selected based on information for the electronic apparatus 150, a measurement configuration, an operational state, certain characteristics of the received acoustic signals, and/or the like.

At S430, the input data is processed using the determined neural network and output data is generated. The output data can indicate whether defects are located in the electronic apparatus, a distribution of the defects, and/or the like. The process 400 then proceeds to S499, and terminates.

The process 400 can be suitably adapted. Step(s) in the process 400 can be modified and/or omitted. Additional step(s) can be added. Any suitable order of implementation can be used.

Figure 5:
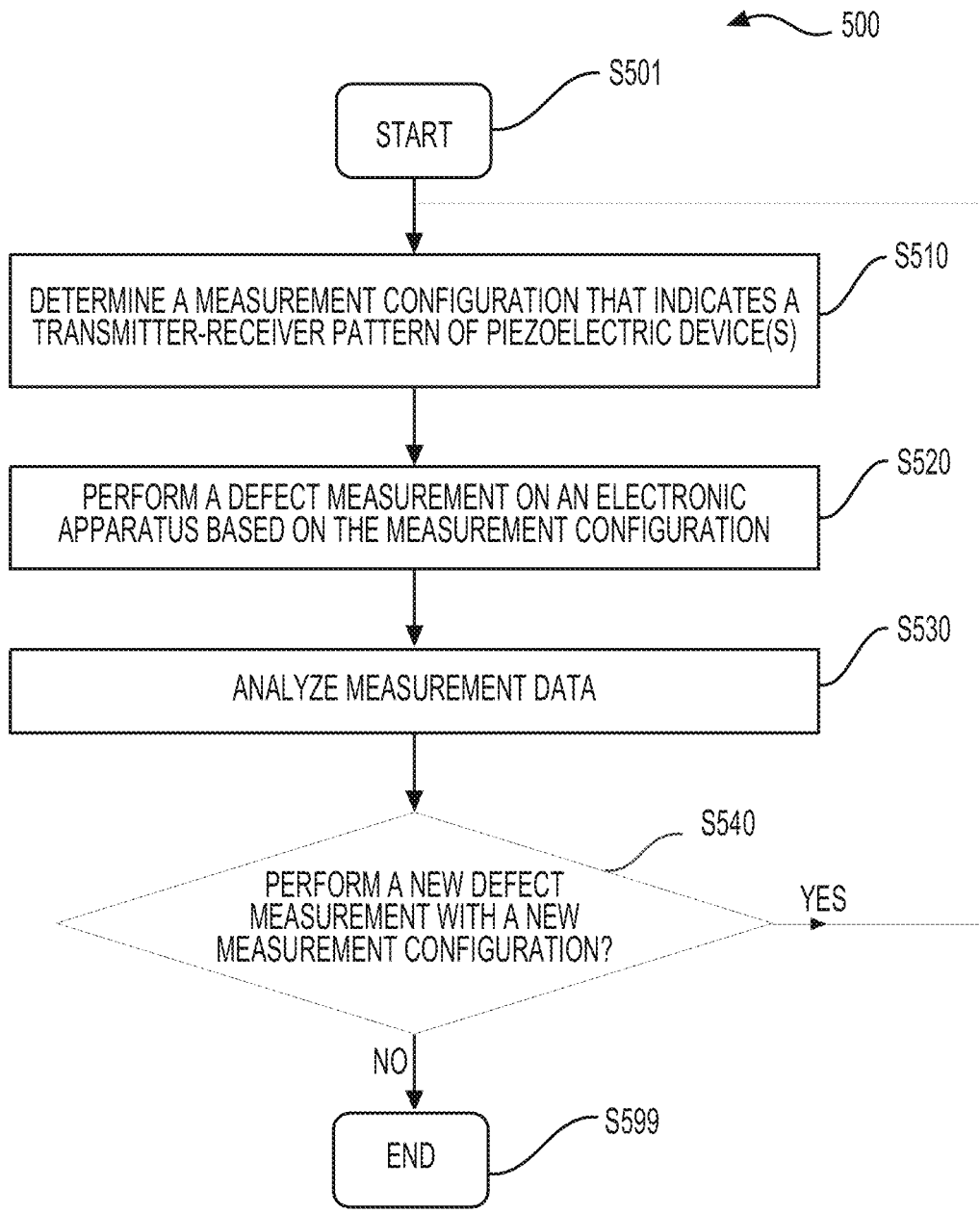
FIG. 5 is a flow chart illustrating a process for defect detection according to the present disclosure.

FIG. 5 is a flowchart outlining an exemplary process 500 according to the present disclosure. The process 500 can be used to determine whether at least one mechanical defect is located in an electronic apparatus (e.g., the electronic apparatus 150), such as a power electronic module in a vehicle. The process 500 starts at S501 and proceeds to S510.

At S510, a measurement configuration for one or more piezoelectric devices in the electronic apparatus can be determined, as described above with reference to FIGS. 1-2.

At S520, a defect measurement can be performed, based on the measurement configuration, on the electronic apparatus by causing a first subset of the one or more piezoelectric devices to transmit one or more acoustic signals and causing a second subset of the one or more piezoelectric devices to receive the one or more acoustic signals, as described above with reference to FIGS. 1-2.

At S530, measurement data, such as the one or more acoustic signals, can be analyzed to determine whether at least one mechanical defect is located in the electronic apparatus (e.g., the electronic apparatus 150), such as in (i) the bonding layer 102, (ii) the electronic device 101, (iii) the substrate block 104, (iv) the first interface 195, and (v) the second interface 196 based on the received one or more acoustic signals.

In some examples, at S540, whether to perform a new defect measurement with a new measurement configuration can be determined. When the new defect measurement with the new measurement configuration is determined to be performed, the process 500 returns to S510 where the new measurement configuration can be determined. Otherwise, the process 500 proceeds to S599, and terminates.

The process 500 can be suitably adapted. For example, certain step(s) can be omitted or combined. Additional step(s) can be added. A sequence of the steps can be adapted. In an example, at S530, the measurement data being analyzed can include acoustic signals obtained in multiple measurements, and the measurement data can be analyzed using machine learning, such as an artificial neural network, as described above.

While aspects of the present disclosure have been described in conjunction with the specific embodiments thereof that are proposed as examples, alternatives, modifications, and variations to the examples may be made. Accordingly, embodiments as set forth herein are intended to be illustrative and not limiting. There are changes that may be made without departing from the scope of the claims set forth below.

What is claimed is:

1. A method for defect detection in an electronic apparatus, the method comprising:
   determining a measurement configuration for a plurality of piezoelectric devices in the electronic apparatus while the electronic apparatus is in operation, the electronic apparatus including a substrate block, an electronic device mounted on the substrate block using a bonding layer, and the plurality of piezoelectric devices being attached to one of the electronic device and the bonding layer;
   performing, based on the measurement configuration, a defect measurement on the electronic apparatus by causing a first subset of the plurality piezoelectric devices to transmit acoustic signals and causing a second subset of the plurality piezoelectric devices to receive the acoustic signals; and
   determining whether at least one mechanical defect is located in at least one of (i) the bonding layer, (ii) the electronic device, (iii) the substrate block, (iv) a first interface between the bonding layer and the electronic device, and (v) a second interface between the electronic device and the substrate block based on the received acoustic signals.

2. The method of claim 1, wherein
the plurality piezoelectric devices are positioned on a surface of the electronic device, the surface being opposite to the first interface; and
the determining whether the at least one mechanical defect is located includes determining whether the at least one mechanical defect is located in at least one of the first interface and the second interface based on the received acoustic signals.

3. The method of claim 1, further comprising:
determining a subsequent measurement configuration for the plurality piezoelectric devices;
performing, based on the subsequent measurement configuration, a subsequent measurement on the electronic apparatus by causing a third subset of the plurality piezoelectric devices to transmit subsequent acoustic signals and causing a fourth subset of the plurality piezoelectric devices to receive the subsequent acoustic signals; and
determining whether the at least one mechanical defect is in the at least one of (i) the bonding layer, (ii) the electronic device, (iii) the substrate block, (iv) the first interface, and (v) the second interface based at least on the received subsequent acoustic signals.

4. The method of claim 1, wherein the measurement configuration further indicates at least one of a frequency and a phase shift of one of the acoustic signals and is adjustable.

5. The method of claim 1, wherein the determining whether the at least one mechanical defect is located is based on the received acoustic signals and machine learning.

6. The method of claim 5, wherein the machine learning is based on an artificial neural network.

7. The method of claim 1, wherein
performing the defect measurement includes performing the defect measurement on the electronic apparatus by implementing the measurement configuration for the first subset and the second subset to obtain the received acoustic signals when the electronic apparatus is in an operational state; and
the method further includes:
   causing the first subset of the plurality piezoelectric devices to transmit the acoustic signals and causing the second subset of the plurality piezoelectric devices to receive reference acoustic signals when the electronic apparatus is in a reference state without a mechanical defect; and
   determining whether the at least one mechanical defect is located in the at least one of (i) the bonding layer, (ii) the electronic device, (iii) the substrate block, (iv) the first interface, and (v) the second interface based on the received acoustic signals and the reference acoustic signals.

8. The method of claim 1, wherein the plurality piezoelectric devices are distinct from the electronic apparatus and the electronic device.

9. The method of claim 1, wherein the electronic device includes one of a high power semiconductor device, a semiconductor chip, a high power diode, and an insulated-gate bipolar transistor.

10. The method of claim 9, wherein the determining whether the at least one mechanical defect is located includes determining whether the at least one mechanical defect is located in the electronic device based on the received acoustic signals.

11. The method of claim 1, wherein the determining whether the at least one mechanical defect is located includes determining whether the at least one mechanical defect is located in the bonding layer based on the received acoustic signals.

12. The method of claim 1, wherein the determining whether the at least one mechanical defect is located includes determining whether the at least one mechanical defect is located in the electronic device based on the received acoustic signals.

13. The method of claim 1, wherein the determining whether the at least one mechanical defect is located includes determining whether the at least one mechanical defect is located in the substrate block based on the received acoustic signals.

14. The method of claim 1, wherein the determining whether the at least one mechanical defect is located includes determining whether the at least one mechanical defect is located in the first interface based on the received acoustic signals.

15. The method of claim 1, wherein the determining whether the at least one mechanical defect is located includes determining whether the at least one mechanical defect is located in the second interface based on the received acoustic signals.

* * * * *